United States Patent
Choi et al.

(10) Patent No.: US 11,735,814 B2
(45) Date of Patent: Aug. 22, 2023

(54) ANTENNA MODULE

(71) Applicant: SAMSUNG ELECTRO-MECHANICS CO., LTD., Suwon-si (KR)

(72) Inventors: Jae Woong Choi, Suwon-si (KR); Jin Won Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 200 days.

(21) Appl. No.: 17/208,172

(22) Filed: Mar. 22, 2021

(65) Prior Publication Data

US 2022/0013893 A1 Jan. 13, 2022

(30) Foreign Application Priority Data

Jul. 9, 2020 (KR) .................. 10-2020-0084612

(51) Int. Cl.
*H01Q 1/40* (2006.01)
*H05K 1/11* (2006.01)
*H05K 1/02* (2006.01)

(52) U.S. Cl.
CPC ............ *H01Q 1/40* (2013.01); *H05K 1/0243* (2013.01); *H05K 1/115* (2013.01); *H05K 2201/10098* (2013.01)

(58) Field of Classification Search
CPC ........ H01Q 1/2283; H01Q 1/243; H01Q 1/40; H01Q 5/35; H01Q 9/0414; H05K 1/0243; H05K 1/115; H05K 1/186; H05K 2201/0376; H05K 2201/10098; H05K 3/007; H05K 3/0097; H05K 3/4602; H05K 3/4644
See application file for complete search history.

(56) References Cited

U.S. PATENT DOCUMENTS

| | | | |
|---|---|---|---|
| 10,938,091 B1* | 3/2021 | Cho | H01Q 1/243 |
| 2018/0331027 A1* | 11/2018 | Chen | H01L 23/49816 |
| 2019/0027804 A1 | 1/2019 | Kim et al. | |
| 2019/0139912 A1* | 5/2019 | Kim | H01L 21/4853 |
| 2019/0181172 A1 | 6/2019 | Kim et al. | |
| 2019/0221917 A1* | 7/2019 | Kim | H01Q 1/2283 |
| 2019/0279950 A1* | 9/2019 | Kim | H01L 23/3114 |
| 2019/0280374 A1* | 9/2019 | Kim | H01L 23/5383 |
| 2020/0153110 A1* | 5/2020 | Kim | H01Q 21/065 |
| 2020/0185815 A1* | 6/2020 | Lee | H01L 23/5389 |
| 2021/0036407 A1* | 2/2021 | Kim | H01Q 21/28 |
| 2021/0050651 A1* | 2/2021 | Jung | H01Q 1/38 |

FOREIGN PATENT DOCUMENTS

| | | |
|---|---|---|
| KR | 10-2005351 B1 | 7/2019 |
| KR | 10-2019952 B1 | 9/2019 |

* cited by examiner

*Primary Examiner* — Thien M Le
(74) *Attorney, Agent, or Firm* — Morgan, Lewis & Bockius LLP

(57) ABSTRACT

An antenna module includes a wiring structure including a plurality of insulating layers, a plurality of wiring layers, and a plurality of via layers; an antenna disposed on an upper surface of the wiring structure; and an encapsulant disposed on the upper surface of the wiring structure and covering at least a portion of the antenna. An uppermost wiring layer of the plurality of wiring layers is connected to the antenna through a connection via of an uppermost via layer of the plurality of via layers. The connection via penetrates at least a portion of the encapsulant.

20 Claims, 10 Drawing Sheets

ANTENNA MODULE

CROSS-REFERENCE TO RELATED APPLICATION(S)

This application claims benefit of priority to Korean Patent Application No. 10-2020-0084612 filed on Jul. 9, 2020 in the Korean Intellectual Property Office, the disclosure of which is incorporated herein by reference in its entirety.

TECHNICAL FIELD

The present disclosure relates to an antenna module.

BACKGROUND

With the advent of 5G, a frequency band has increased, and an antenna module for transmitting/receiving the frequency has become more important. An antenna module may have a form in which a chip-type antenna may be surface-mounted on an antenna substrate through solder bonding. However, there may be difficulty in reducing a size of the above-described type of antenna module, and as solder bonding is used, antenna performance may be degraded due to signal loss.

SUMMARY

An aspect of the present disclosure is to provide an antenna module which may have a reduced size by reducing a thickness, or the like.

Another aspect of the present disclosure is to provide an antenna module which may improve antenna performance.

According to an aspect of the present disclosure, an antenna module in which an antenna is embedded may be provided.

According to another aspect of the present disclosure, an antenna may be connected to a wiring structure through a plating technique, rather than solder bonding.

For example, according to an aspect of the present disclosure, an antenna module includes a wiring structure including a plurality of insulating layers, a plurality of wiring layers, and a plurality of via layers; an antenna disposed on an upper surface of the wiring structure; and an encapsulant disposed on the upper surface of the wiring structure and covering at least a portion of the antenna. An uppermost wiring layer of the plurality of wiring layers is connected to the antenna through a connection via of an uppermost via layer of the plurality of via layers. The connection via penetrates at least a portion of the encapsulant.

For example, according to an aspect of the present disclosure, an antenna module includes a wiring structure including a plurality of insulating layers, a plurality of wiring layers, and a plurality of via layers; an antenna disposed on an upper surface of the wiring structure; and an encapsulant disposed on the upper surface of the wiring structure and covering at least a portion of the antenna. An uppermost wiring layer of the plurality of wiring layers is connected to the antenna through a connection via of an uppermost via layer of the plurality of via layers. The encapsulant is disposed in at least a portion of a region between an upper surface of an uppermost insulating layer of the plurality of insulating layers and a lower surface of the antenna.

For example, according to an aspect of the present disclosure, an antenna module includes a wiring structure including a plurality of insulating layers, a plurality of wiring layers, and a plurality of via layers; an antenna disposed on an upper surface of the wiring structure; and an encapsulant disposed on the upper surface of the wiring structure and covering at least a portion of the antenna. An uppermost wiring layer of the plurality of wiring layers is connected to a pad pattern of the antenna disposed on a lower surface of the antenna. An upper surface of the antenna opposing the lower surface of the antenna is exposed from the encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
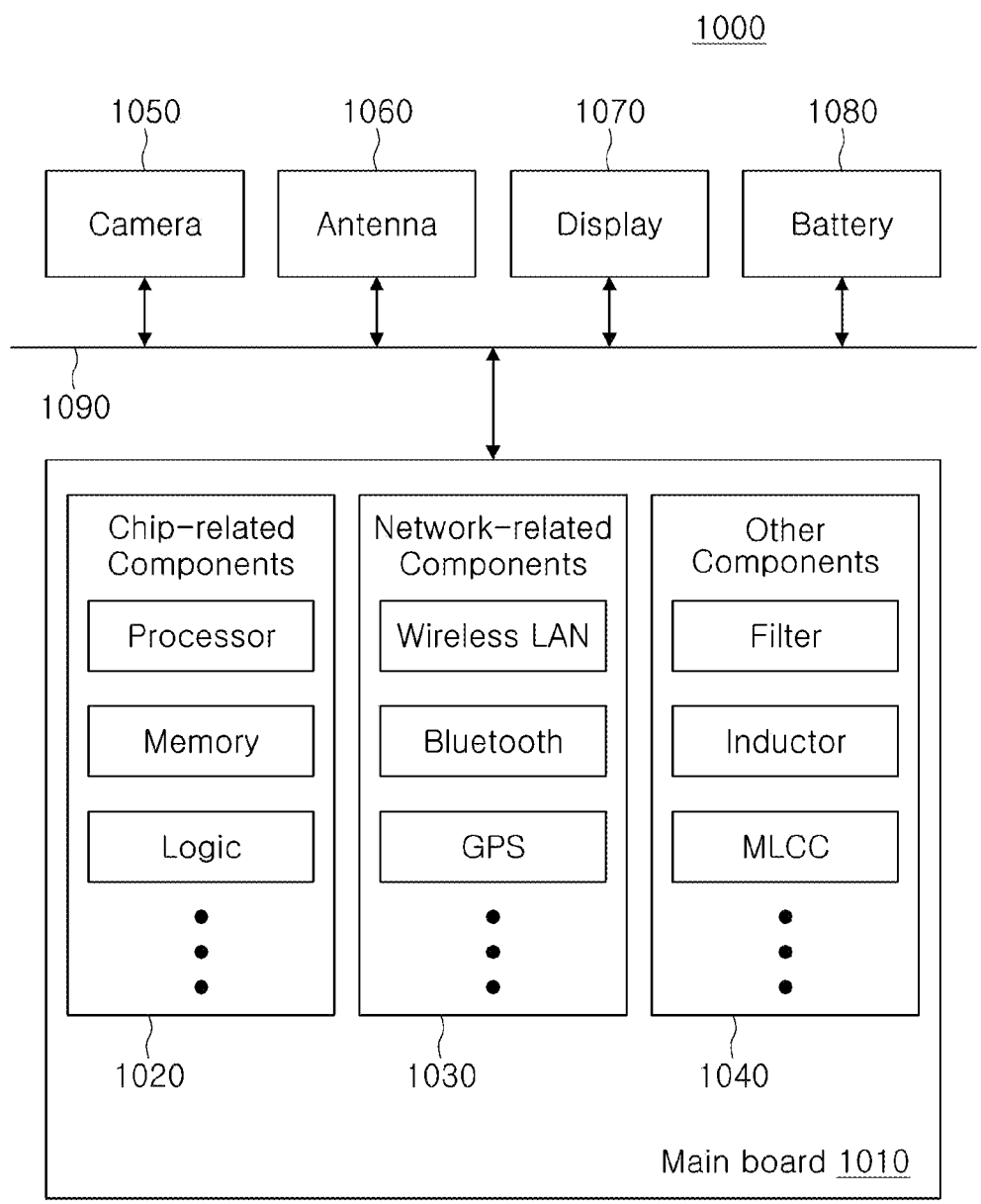
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related components 1020 may have a package form including the above-described chip.

The network related components 1030 may include protocols such as wireless fidelity (Wi-Fi) (Institute of Electrical and Electronics Engineers (IEEE) 802.11 family, or the like) , worldwide interoperability for microwave access (WiMAX) (IEEE 802.16 family, or the like), IEEE 802.20, long term evolution (LTE) , evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
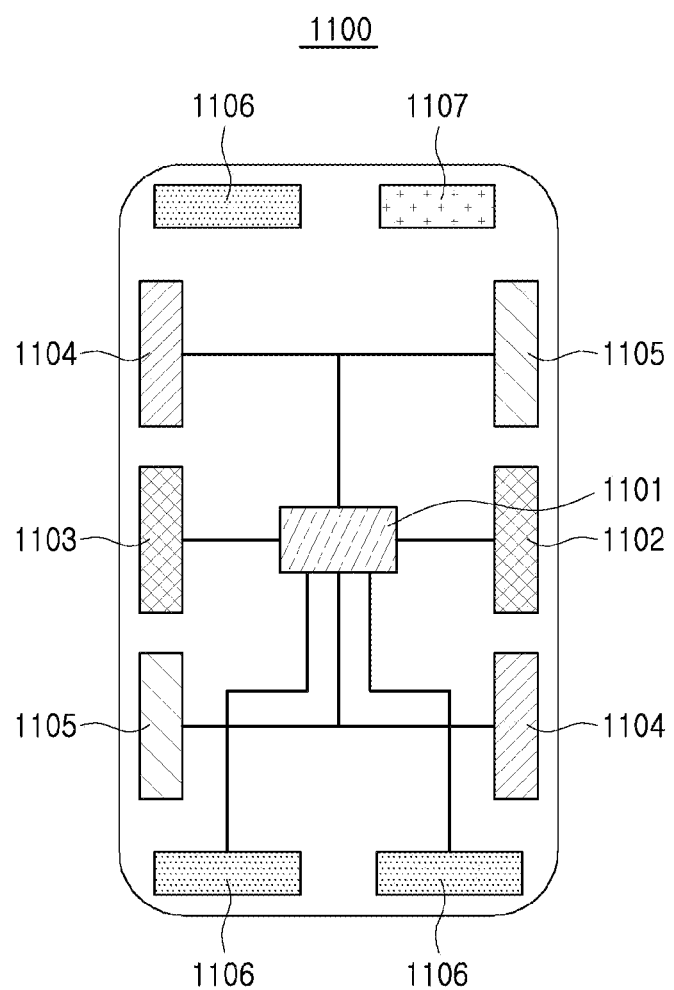
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A modem 1101, and various types of antenna modules 1102, 1103, 1104, 1105, and 1106 connected to the modem 1101 through a rigid printed circuit board, a flexible printed circuit board, and/or a rigid-flexible printed circuit board may be disposed in the smartphone 1100. If necessary, a Wi-Fi module 1107 may also be disposed. The antenna modules 1102, 1103, 1104, 1105, and 1106 may include various frequency bands for 5G mobile communication, such as the antenna module 1102 for a 3.5 GHz band frequency, the antenna module 1103 for a 5 GHz band frequency, the antenna module 1104 for a 28 GHz band frequency, the antenna module 1105 for a 39 GHz band frequency, or the like, and may also include the other antenna module 1106 for 4 G, but an example embodiment thereof is not limited thereto. The electronic device is not limited to the smartphone 1100, and may be implemented by another electronic device described above.

Figure 3:
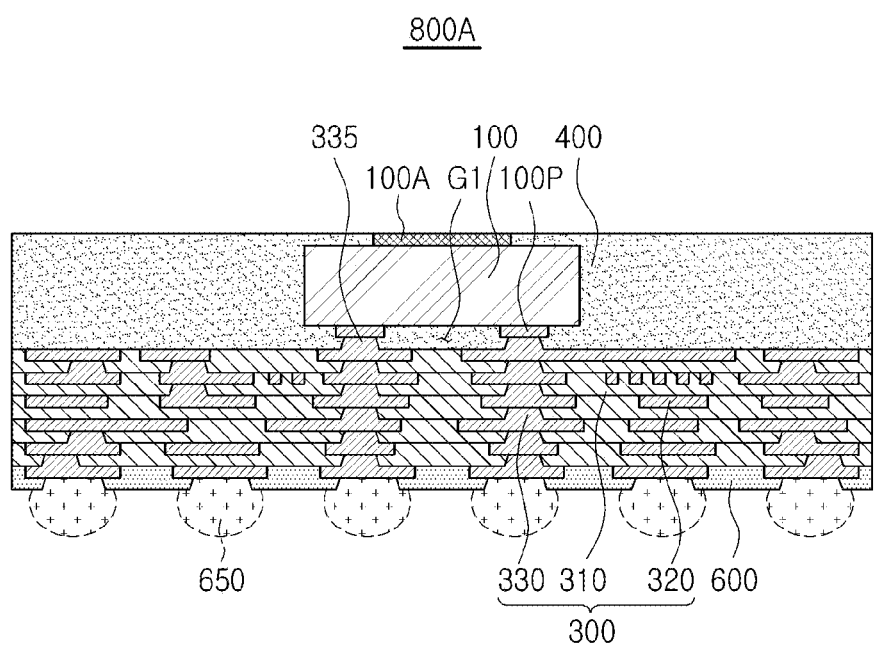
FIG. 3 is a cross-sectional diagram illustrating an example of an antenna module.

FIG. 3 is a cross-sectional diagram illustrating an example of an antenna module.

Referring to the diagram, an antenna module 800A in the example embodiment may include a wiring structure 300 including a plurality of insulating layers 310, a plurality of wiring layers 320, and a plurality of via layers 330, an antenna 100 disposed on an upper surface of the wiring structure 300, and an encapsulant 400 disposed on an upper surface of the wiring structure 300 and covering at least a portion of each of the antenna 100. If necessary, the antenna module 800A in the example embodiment may include a passivation layer 600 disposed on a lower surface of the wiring structure 300 and having an opening for covering at least a portion of a lowermost wiring layer 320 of the plurality of wiring layers 320 and exposing at least the other portion thereof, and/or an electrical connection metal 650 disposed on the opening of the passivation layer 600 and connected to the other exposed portion of the lowermost wiring layer 320.

The uppermost wiring layer 320 of the plurality of wiring layers 320 may be connected to the antenna 100 through a connection via 335 of an uppermost via layer 330 of the plurality of via layers 330. For example, the encapsulant 400 may fill at least a portion of a region G1 between an upper surface of the uppermost insulating layer 310 of the plurality of insulating layers 310 and a lower surface of the antenna 100, and the connection via 335 may penetrate at least a portion of the encapsulant 400 and maybe connected to a pad pattern 100P of the antenna 100.

Accordingly, the antenna module 800A in the example embodiment may have a form in which the antenna 100 may be embedded therein, and the antenna 100 may be electrically connected to the wiring layer 320 in the substrate through the connection via 335, rather than soldering bonding. Accordingly, a thickness of the antenna module 800A may be reduced, and the antenna module 800A may thus have a reduced size. Also, signal loss may be reduced through electrical connection using the connection via 335 such that antenna performance may improve.

Meanwhile, the upper surface of the uppermost insulating layer 310 may be disposed on a level the same as a level of the upper surface of the uppermost wiring layer 320. Also, the upper surface of the encapsulant 400 maybe disposed on a level the same as a level of the upper surface of the antenna 100, that is, for example, the upper surface of the uppermost antenna pattern 100A which is the uppermost element of the antenna 100. The configuration in which the elements may be disposed on the same level includes the configuration in which the elements maybe disposed on completely or roughly the same level. The antenna 100 maybe easily embedded in the encapsulant 400 through the carrier such that the wiring structure 300 may be easily formed on the encapsulant 400. Accordingly, the antenna 100 may be buried in the encapsulant 400 such that the upper surface of the uppermost component, the antenna pattern 100A, may be exposed from the upper surface of the encapsulant 400. Also, the uppermost wiring layer 320 may be buried in the upper side of the uppermost insulating layer 310 and may be in contact with the encapsulant 400.

In the description below, each of the elements of the antenna module 800A according to an example embodiment will be described in greater detail with reference to the drawings.

The antenna 100 maybe configured as a chip-type antenna. For example, the antenna 100 may be one of various types of chip-type antennas, which may basically include a dielectric body, and the antenna pattern 100A and the pad pattern 100P may be disposed on an upper surface and a lower surface of the dielectric body, respectively. Only a single antenna 100 may be disposed, but an example embodiment thereof is not limited thereto, and a plurality of the antennas 100 may be disposed side by side on the wiring structure 300. For example, the antenna 100 may be arranged in various forms, such as an array of 1×2, an array of 1×4, and an array of 2×2.

The dielectric body of the antenna 100 may include a material having a high dielectric constant Dk. For example, the dielectric body may include a ceramic layer and/or a ceramic-polymer composite layer. Alternatively, the dielectric body may include an insulating layer including an insulating material having a high dielectric constant (Dk) such as polytetrafluoroetyhlene (PTFE). The ceramic-polymer composite layer may be obtained by dispersing a ceramic filler in an organic binder. As the organic binder, a polymer such as PTFE or epoxy may be used. As the ceramic filler, a filler including $SiO_2$, $TiO_2$, $Al_2O_3$, or the like, may be used. The ceramic filler may have various shapes such as an angular shape or a round shape. A diameter of the ceramic filler may be 50 μm or less. The ceramic-polymer composite layer may include glass fibers as a reinforcing material if necessary.

Each of the antenna pattern 100A and the pad pattern 100P may include a metal material. As the metal material, copper (Cu), aluminum (Al), silver (Ag), Tin (Sn), gold (Au), nickel (Ni), lead (Pb), titanium (Ti), or an alloy thereof, maybe used. The antenna pattern 100A may be a coupling pattern, and a patch pattern coupled thereto may further be disposed in the dielectric body. RF signals may be transmitted and received in the thickness direction (z-direction) through the antenna pattern 100A. The pad pattern 100P may connect the antenna 100 to the wiring structure 300. At least one of the pad patterns 100P may be connected to the patch pattern disposed in the dielectric body through a feed via disposed in the dielectric body, and may also be connected to the feed pattern of the wiring structure 300. At least the other one of the pad patterns 100P may be connected to a ground of the wiring structure 300.

The wiring structure 300 may include a plurality of insulating layers 310, a plurality of wiring layers 320, and a plurality of via layers 330. The plurality of wiring layers 320 may be disposed on and/or within the plurality of insulating layers 310, respectively. The plurality of via layers 330 may penetrate the plurality of insulating layers 310, respectively, and the uppermost via layer 330 may penetrate at least a portion of the encapsulant 400. The number of the plurality of insulating layers 310, the number of the plurality of wiring layers 320, and the number of the plurality of via layers 330 may not be limited to any particular number, and may be greater or less than the examples in the diagram.

The plurality of insulating layers 310 may include an insulating material. As an insulating material, a thermosetting resin such as an epoxy resin, a thermoplastic resin such as polyimide, or a material including a reinforcing material such as a glass fiber (glass fiber, glass cloth, glass fabric) and/or an inorganic filler along with the above-mentioned resin, such as prepreg, an Ajinomoto built-up film (ABF), or the like, may be used. However, an example embodiment thereof is not limited thereto, and each insulating layer 310 may include a thermoplastic resin layer and a thermosetting resin layer, if necessary. For example, the plurality of insulating layers 310 may include a laminate in which a thermoplastic resin layer and a thermosetting resin layer are alternately laminated. The thermoplastic resin layer may include a material effective for transmitting a high frequency signal, and the thermosetting resin layer may include a material advantageous for transmitting a high frequency signal and having good bonding properties. Through such a multilayer resin layer, an insulating body, advantageous for high-frequency signal transmission and having excellent adhesive properties, maybe provided.

As a thermoplastic resin layer, for easy high- frequency signal transmission, a liquid crystal polymer (LCP), polytetrafluoroethylene (PTFE), polyphenylene sulfide (PPS), polyphenylene ether (PPE), polyimide (PI), or the like, maybe used. A dielectric loss factor (Df) may be adjusted according to the type of resin included in the thermoplastic resin layer, the type of filler contained in the resin, and the content of the filler. A dielectric loss factor (Df) is a value for the dielectric loss, and the dielectric loss refers to the power loss generated when an alternating current (AC) electric field is formed in a resin layer (dielectric). The dielectric loss factor (Df) is proportional to dielectric loss, and the smaller the dielectric loss factor (Df), the smaller the dielectric loss. The thermoplastic resin layer having low dielectric loss properties may be advantageous in terms of reducing loss in high-frequency signal transmission. A dielectric loss factor (Df) of the thermoplastic resin layer maybe 0.003 or less, and may be, for example, 0.002 or less. The thermoplastic resin layer may also have low dielectric constant properties, and a dielectric constant (Dk) may be 3.5 or less, for example.

As the thermosetting resin layer, for easy high-frequency signal transmission, a modified polyimide (PI), polyphenylene ether (PPE), a modified epoxy (epoxy), and the like, may be used. A dielectric loss factor (Df) may be adjusted according to the type of resin of the thermosetting resin layer, the type of filler contained in the resin, and the content of the filler. The thermosetting resin layer having low dielectric loss properties may be advantageous in terms of reducing loss in high frequency signal transmission. The dielectric loss factor (Df) of the thermosetting resin layer may be 0.003 or less, and may be 0.002 or less, for example. The dielectric constant (Dk) of the thermosetting resin layer may be 3.5 or less.

The plurality of wiring layers 320 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of wiring layers 320 may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. If necessary, a primer copper foil may be further included. The plurality of wiring layers 320 may perform various functions according to the design of a respective layer. For example, the plurality of wiring layers 320 may include a feed pattern connected to the antenna 100, and may also include a ground pattern and a power pattern. If necessary, the plurality of wiring layers 320 may include another signal transmission pattern other than the feed pattern. Each of these patterns may include a line pattern, a plane pattern, and/or a pad pattern.

The plurality of via layers 330 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of via layers 330 may be formed by a plating process such as AP, SAP, MSAP, or TT, and may thus include a seed layer, an electroless plating layer, and an electrolytic plating layer formed on the basis of the seed layer. The plurality of via layers 330 may perform various functions according to a design. For example, the plurality of via layers 330 may include a connection via for connection of a feed pattern, a connection via for ground connection, a connection via for power connection, and a connection vias for other signal connection. For example, the via layer 330 disposed on the uppermost side may include the connection vias 335 described above, and the connection via 335 may include a connection via for feed and/or a connection via for ground. Each connection via may be entirely filled with a metal material, or a metal material may be formed along a wall surface of the via hole. Also, the connection via may have various shapes such as a tapered shape.

The encapsulant 400 may include an insulating material. As the insulating material, a thermosetting resin such as an epoxy resin or a thermoplastic resin such as polyimide, and the above-mentioned resin including a reinforcing material such as an inorganic filler, such as ABF, may be used. However, an example embodiment thereof is not limited thereto, and other types of insulating resins having a low dielectric loss factor Df may be used. The encapsulant 400 may cover the entire side of the antenna 100, and may cover at least a portion of each of the upper and lower surfaces of the antenna 100.

The passivation layer 600 may include an insulating material. As the insulating material, a thermosetting resin such as an epoxy resin or a thermoplastic resin such as polyimide, and the above-mentioned resin including a reinforcing material such as an inorganic filler, such as ABF, may be used. However, an example embodiment thereof is not limited thereto, and solder resist (SR) including a photosensitive material may be used. The passivation layer 600 may cover at least a portion of the wiring layer 320 disposed at the lowermost side, and may have an opening exposing at least a portion of the other portion.

The electrical connection metal 650 may be disposed on the opening of the passivation layer 600 and may be connected to at least a portion of the other exposed portion of the wiring layer 320 disposed in the lowermost side. The electrical connection metal 650 may provide a path for physically and/or electrically connecting the antenna module 800A to an external entity. The electrical connection metal 650 may be formed of a low melting point metal having a lower melting point than copper (Cu), such as tin (Sn) or an alloy including tin (Sn), for example. For example, the electrical connection metal 650 may be formed of solder, but an example embodiment thereof is not limited thereto. The electrical connection metal 650 may be a land, a ball, a pin, or the like, and may include multiple layers or a single layer. When the electrical connection metal 650 includes multiple layers, a copper pillar and solder may be included, and when the electrical connection metal 650 includes a single layer, a tin-silver solder may be included, but an example embodiment thereof is not limited thereto.

Figure 4:
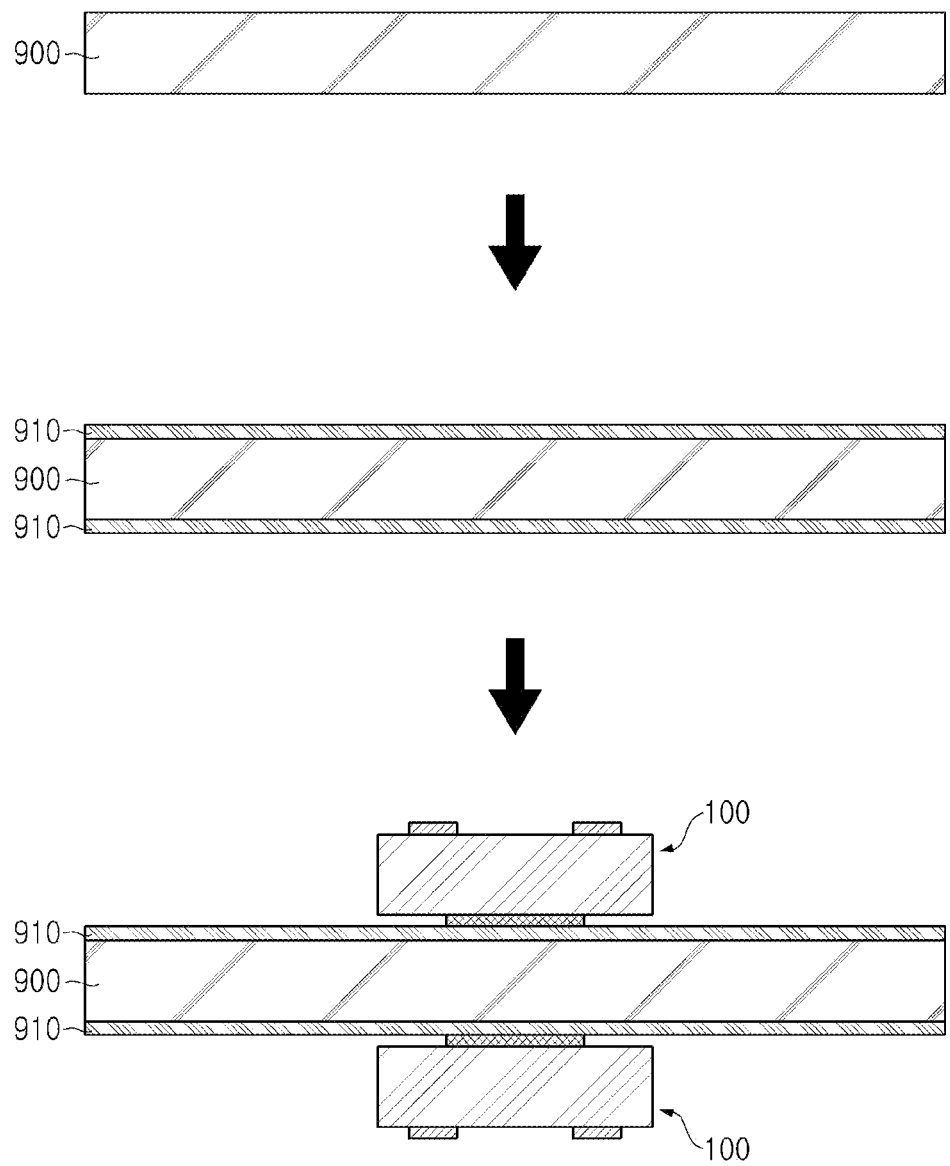
FIGS. 4 to 6 are cross-sectional diagrams illustrating an example of processes of manufacturing the antenna module illustrated in FIG. 3.
Figure 5:
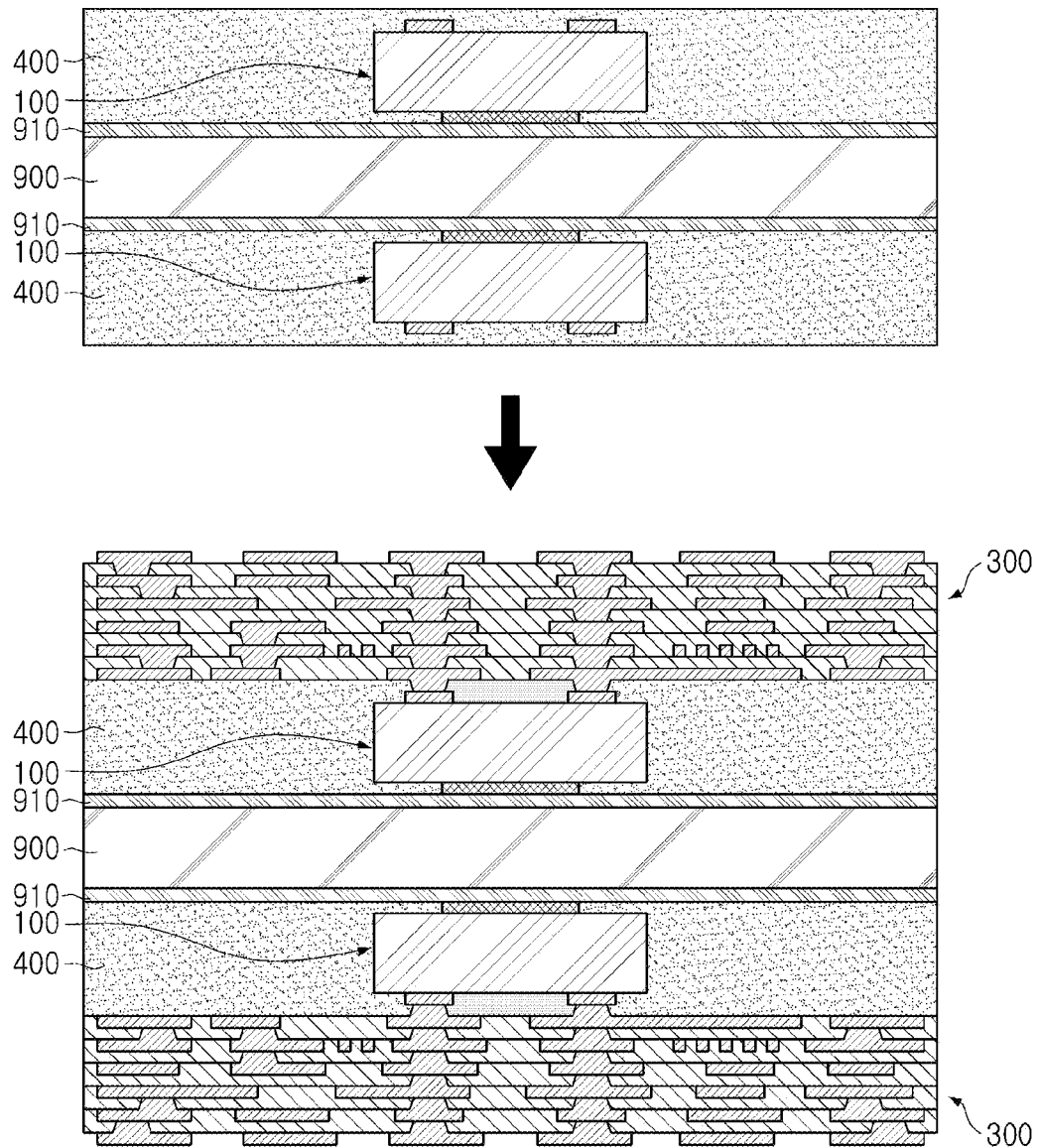
Figure 6:
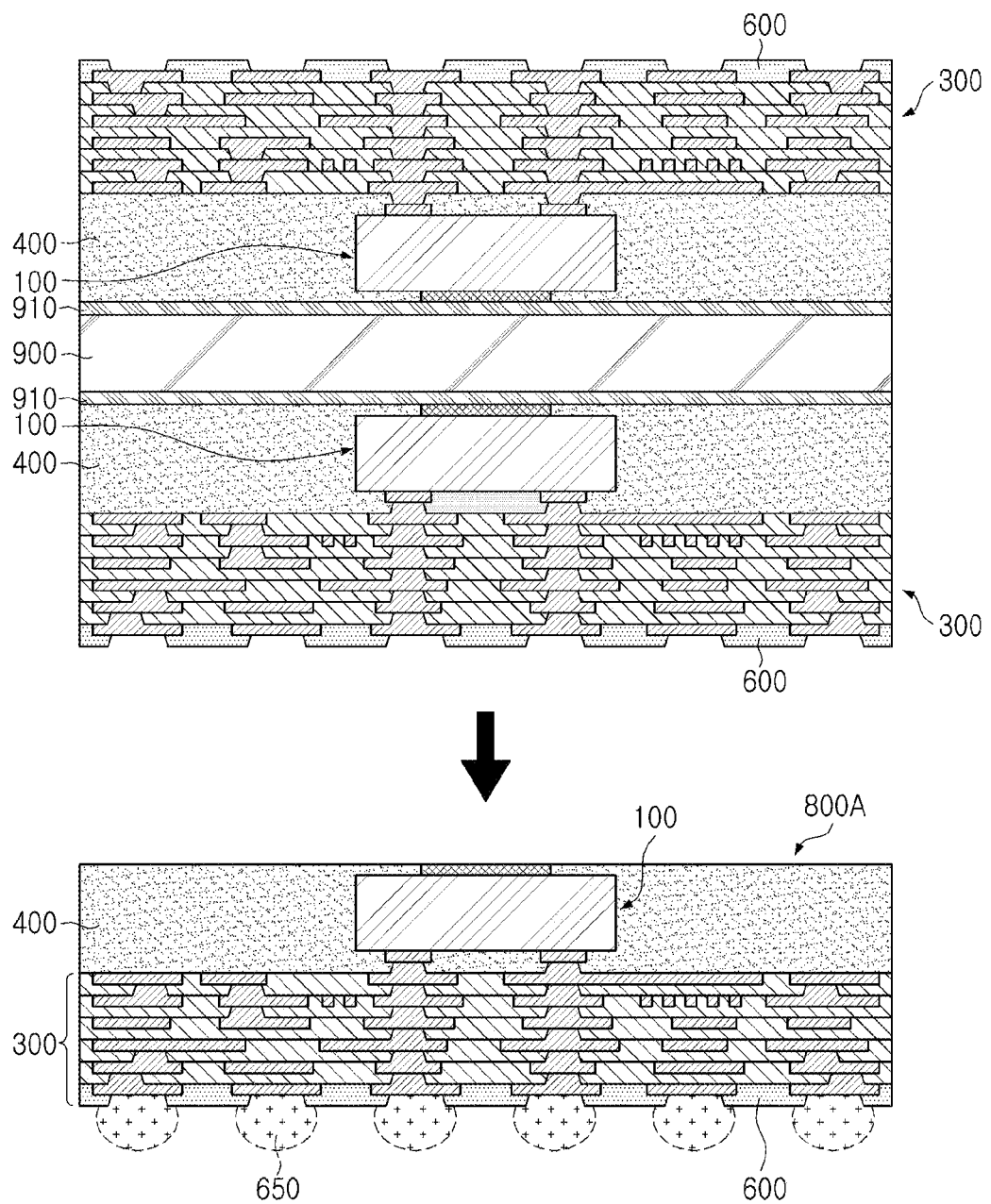

FIGS. 4 to 6 are cross-sectional diagrams illustrating an example of processes of manufacturing the antenna module illustrated in FIG. 3

Referring to FIG. 4, a carrier 900 may be prepared. As the carrier 900, a glass substrate, a metal substrate, an insulating substrate, or the like, maybe used. Thereafter, an adhesive film 910 such as a die attach film (DAF) may be attached on the carrier 900. Thereafter, the chip-type antenna 100 may be attached to the adhesive film 910 to be faced up.

Referring to FIG. 5, an encapsulant 400 in which the antenna 100 may be buried may be formed by layering ABFs. Thereafter, the wiring structure 300 may be formed on the encapsulant 400 by a build-up process. For example, a via hole for exposing the pad pattern 100P of the antenna 100 may be formed in the encapsulant 400 by a laser process, the wiring layer and the via layer may be formed by a plating process, the insulating material may be laminated on the encapsulant 400, a via hole may be formed in the insulating material by a laser process, and the wiring layer and the via layer may be repeatedly formed by a plating process, thereby forming the wiring structure 300.

Referring to FIG. 6, if necessary, a passivation layer 600 may be formed on the wiring structure 300. Thereafter, the manufactured structure may be separated from the carrier 900 and the adhesive film 910 may be removed. If necessary, an electrical connection metal 650 may be further formed on the opening of the passivation layer 600. Through a series of the processes, the antenna module 800A according to the example described above may be manufactured.

As the other descriptions are substantially the same as those described above, overlapping descriptions will not be repeated.

Figure 7:
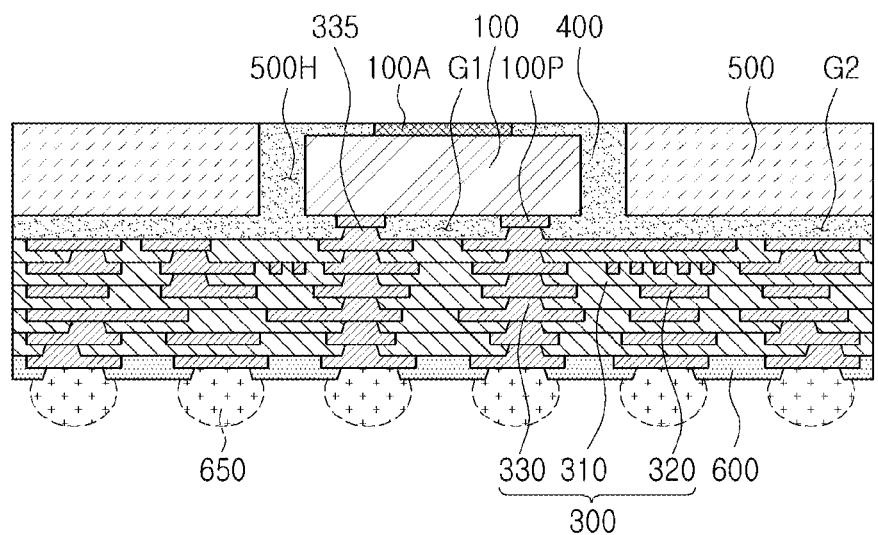
FIG. 7 is a cross-sectional diagram illustrating another example of an antenna module.

FIG. 7 is a cross-sectional diagram illustrating another example of an antenna module.

Referring to the diagram, an antenna module 800B in another example embodiment may further include a core structure 500 disposed on an upper surface of a wiring structure 300, spaced apart from the antenna 100, and surrounding at least a portion of a side surface of the antenna 100, differently from the antenna module 800A described in the aforementioned example embodiment. In the description below, the antenna module 800B of another example embodiment will be described, and overlapping descriptions will not be repeated.

The core structure 500 may further improve rigidity of the antenna module 800B depending on a specific material, and may help to ensure thickness uniformity of the encapsulant 400. The core structure 500 may have a through-hole 500H, and an antenna 100 may be disposed in the through-hole 500H. Since the core structure 500 has the through-hole 500H and the antenna 100 is disposed therein, the antenna 100 may be easily disposed and embedded. The through-hole 500H of the core structure 500 may have an internal wall continuously surrounding the side surface of the antenna 100, but an example embodiment thereof is not limited thereto. If necessary, the core structure 500 may include a plurality of core units spaced apart from each other.

The core structure 500 may include various types of materials. For example, an insulating material may be used. In this case, as the insulating material, a material including glass fiber and a reinforcing material, such as an insulating material of copper clad laminate (CCL) or a prepreg may be used. Alternatively, a metal having excellent rigidity and thermal conductivity may be used, and, for example, an Fe—Ni based alloy may be used. Also, other glass, ceramic, plastic, etc. may be used.

The upper surface of the core structure 500 may be disposed on a level the same as a level of the upper surface of the encapsulant 400. As described above, the antenna 100 may be easily buried in the encapsulant 400 through the carrier, and in this case, the core structure 500 may also be buried in the encapsulant 400 together with the antenna 100, and accordingly, the core structure 500 may be buried in the encapsulant 400 such that the upper surface maybe exposed from the upper surface of the encapsulant 400. Also, the encapsulant 400 may also fill a region G1 between the upper surface of the uppermost insulating layer 310 and the lower surface of the antenna 100 and at least a portion of a region G2 between the upper surface of the uppermost insulating layer 310 and the lower surface of the core structure 500.

As the other descriptions are substantially the same as those described above, and overlapping descriptions will not be repeated.

Figure 8:
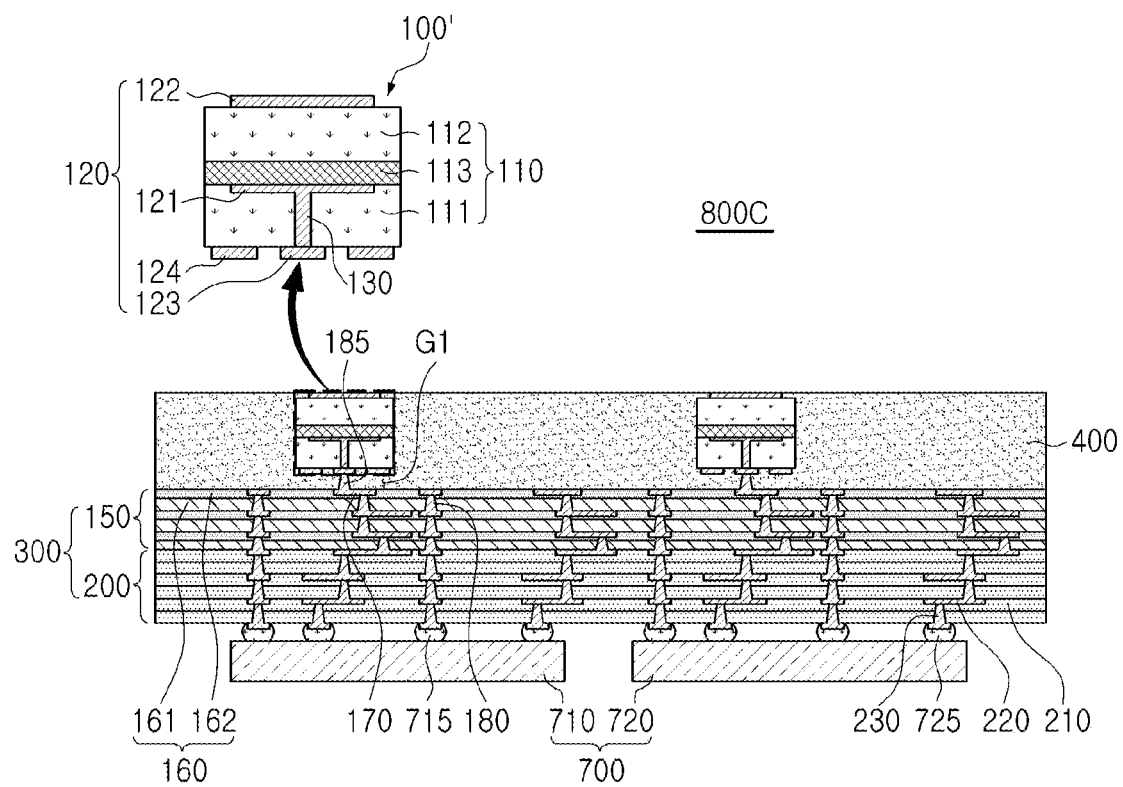
FIG. 8 is a cross-sectional diagram illustrating another example of an antenna module.

FIG. 8 is a cross-sectional diagram illustrating another example of an antenna module.

Figure 9:
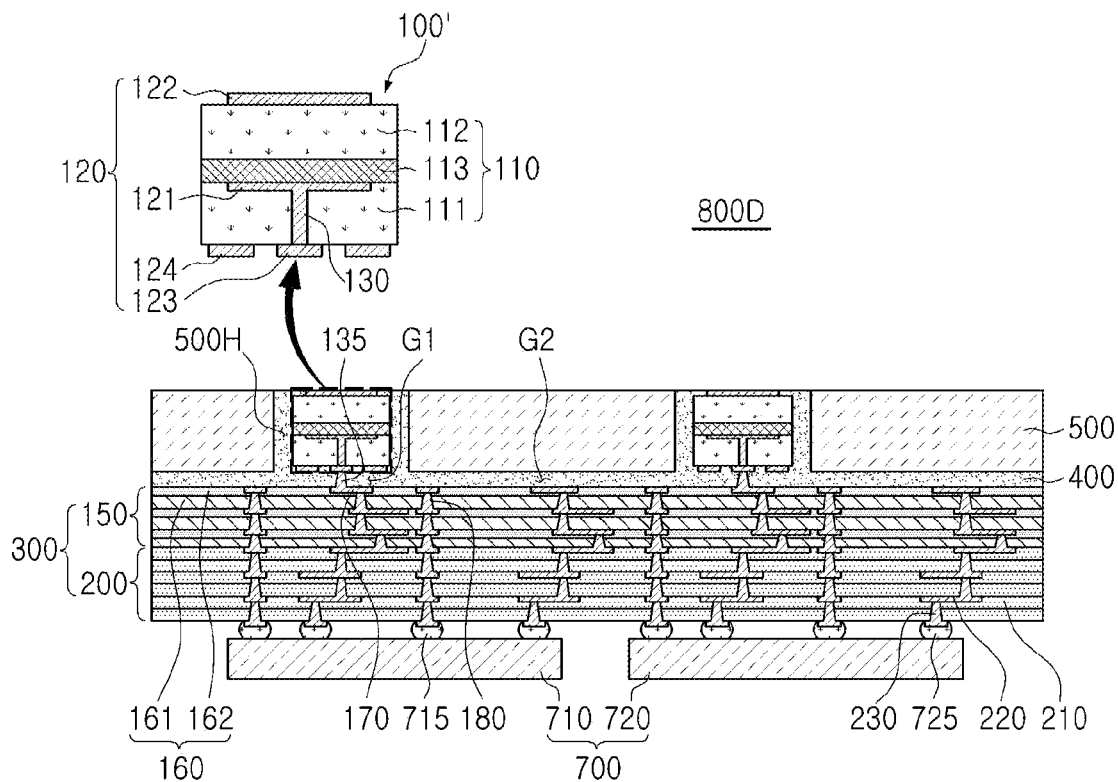
FIG. 9 is a cross-sectional diagram illustrating another example of an antenna module.

FIG. 9 is a cross-sectional diagram illustrating another example of an antenna module.

Referring to the diagrams, in the antenna module 800C and 800D in another example, the wiring structure 300 may include a first region including a plurality of first insulating layer 160, a plurality of first wiring layers 170, and a plurality of first via layers 180, and a second region 200 disposed above the first region 150 and including a plurality of second insulating layers 210, a plurality of second wiring layers 220, and a plurality of second via layers 230. The first region 150 may mainly function as an antenna member, and the second region 200 may mainly function as a redistribution member. For example, at least a portion of the plurality of first insulating layers 160 may include a material having a dielectric loss factor Df lower than that of at least a portion of the plurality of second insulating layers 210.

The plurality of first insulating layers 160 may include a laminate in which a thermoplastic resin layer 161 and a thermosetting resin layer 162 are alternately layered. The thermoplastic resin layer 161 may include a material effective for transmitting high-frequency signals, and the thermosetting resin layer 162 may include a material advantageous for transmitting high-frequency signals and having excellent bonding properties. Through the multilayer resin layers 161 and 112, an insulating body advantageous for high-frequency signal transmission and having excellent adhesive properties may be provided. Each of the plurality of first wiring layers 170 may be disposed on the thermoplastic resin layer 161 and may be buried in the thermosetting resin layer 162, and may be connected to each other through the plurality of first via layers 180. Each of the plurality of first via layers 180 may include a connection via penetrating the thermoplastic resin layer 161 and the thermosetting resin layer 162 adjacent to each other at the same time.

As the thermoplastic resin layer 161, in terms of high-frequency signal transmission, a liquid crystal polymer (LCP), PTFE (polytetrafluoroethylene), PPS (polyphenylene sulfide), PPE (polyphenylene ether), PI (polyimide), or the like, may be used. A dielectric loss factor Df may be adjusted according to the type of resin in the thermoplastic resin layer 161, the type of filler contained in the resin, and the content of the filler. A dielectric loss factor (Df) is a value for the dielectric loss, and the dielectric loss refers to power loss generated when an alternating current (AC) electric field is formed in the resin layer (dielectric). The dielectric loss factor (Df) is proportional to dielectric loss, and the smaller the dielectric loss factor (Df), the smaller the dielectric loss. The thermoplastic resin layer 161 having low dielectric loss properties maybe advantageous in terms of reducing loss in high frequency signal transmission. Each of the dielectric loss factors Df of the thermoplastic resin layer 161 may be 0.003 or less, and maybe 0.002 or less, for example. The dielectric constant (Dk) of the thermoplastic resin layer 161 may be 3.5 or less.

As the thermosetting resin layer 162, in terms of high-frequency signal transmission, polyphenylene ether (PPE), modified polyimide (PI), modified epoxy, and the like may be used. The dielectric loss factor Df may be adjusted according to the type of resin in the thermosetting resin layer 162, the type of filler included in the resin, and the content of the filler. The thermosetting resin layer 162 having low dielectric loss properties may be advantageous in terms of reducing loss in high frequency signal transmission. The dielectric loss factor (Df) of the thermosetting resin layer 162 may be 0.003 or less, and maybe 0.002 or less, for example. The dielectric constant (Dk) of the thermosetting resin layer 162 may be 3.5 or less.

A thickness of the thermoplastic resin layer 161 may be greater than a thickness of the thermoplastic resin layer 161. The above-described thickness relationship may be desirable in terms of high-frequency signal transmission. An interface between the thermoplastic resin layer 161 and the thermoplastic resin layer 161 vertically adjacent to each other may include a rough surface. The rough surface refers to a surface that has been roughened to have serrations. The thermoplastic resin layer 161 and the thermoplastic resin layer 161 adjacent upwardly and downwardly to each other may secure adhesive force towards each other by the rough surface.

The plurality of first wiring layers 170 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of first wiring layers 170 may be formed by a plating process such as AP, SAP, MSAP, or TT, and may thus include a seed layer, an electroless plating layer, and an electrolytic plating layer formed on the basis of the seed layer. If necessary, a primer copper foil may be further included. The plurality of first wiring layers 170 may perform various functions according to the design of a respective layer. For example, the plurality of first wiring layers 170 may include a feed pattern connected to the antenna 100, and may also include a ground pattern disposed around the feed pattern, and may also include a power pattern. Each of these patterns may include a line pattern, a plane pattern, and/or a pad pattern.

The plurality of first via layers 180 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of first via layers 180 may be formed by a plating process such as AP, SAP, MSAP, or TT, and may thus include a seed layer, an electroless plating layer, and an electrolytic plating layer formed on the basis of the seed layer. The plurality of first via layers 180 may perform various functions according to a design. For example, the plurality of first via layers 180 may include a connection via for connection of a feed pattern, a connection via for ground connection, a connection via for power connection, and a connection vias for other signal connection. An uppermost via layer of the plurality of first via layers 180 may include the connection vias 185 and 187 described above, and the connection vias 185 and 187 may include a connection via for feed and/or a connection via for ground. Each connection via may be entirely filled with a metal material, or a metal material may be formed along a wall surface of the via hole. Also, the connection via may have various shapes such as a tapered shape.

The plurality of second insulating layers 210 may include an insulating material. As the insulating material, a thermosetting resin such as an epoxy resin or a thermoplastic resin such as polyimide, and a material including the above-mentioned resin and a reinforcing material such as glass fiber and/or an inorganic filler, such as prepreg, ABF, or photoimageable dielectric (PID), for example, may be used.

The plurality of second wiring layers 220 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of second wiring layers 220 may be formed by a plating process such as AP, SAP, MSAP, or TT, and may thus include a seed layer, an electroless plating layer, and an electrolytic plating layer formed on the basis of the seed layer. If necessary, a primer copper foil may be further included. The plurality of second wiring layers 220 may perform various functions according to the design of a respective layer. For example, the plurality of second wiring layers 220 may include a ground pattern, a power pattern, and a signal pattern. A signal pattern may include various signals other than a ground pattern, a power pattern, or the like, such as an antenna signal, a data signal, or the like, for example. Each of these patterns may include a line pattern, a plane pattern, and/or a pad pattern.

The plurality of second via layers 230 may include a metal material. As a metal material, copper (Cu), aluminum (Al), silver (Ag), Tin (Sn), gold (Au), nickel (Ni), lead (Pb), titanium (Ti), or an alloy thereof may be used. The plurality of second via layers 230 maybe formed by a plating process such as AP, SAP, MSAP, or TT, and may thus include a seed layer, an electroless plating layer, and an electrolytic plating layer formed on the basis of the seed layer. The plurality of second via layers 230 may perform various functions according to a design. For example, the plurality of second via layers 230 may include a connection via for signal connection, a connection via for ground connection, and a connection via for power connection. Each connection via may be entirely filled with a metal material, or a metal material may be formed along a wall surface of the via hole. Also, the connection via may have various shapes such as a tapered shape.

Also, in the antenna module 800C and 800D in the example embodiment, the antenna 100' may be a chip-type patch antenna including a dielectric 110 and antenna pattern 121, 122, and 123 formed in the dielectric 110, differently from the antenna modules 800A and 800B described in the aforementioned example embodiment. A plurality of the chip-type patch antennas may be independently disposed on the wiring structure 300. The plurality of antennas 100' may be arranged in various forms, such as an array of 1×2, an array of 1×4, and an array of 2×2.

The dielectric 110 may include dielectric layers 111 and 112, and a bonding layer 113 disposed between the dielectric layers 111 and 112 and bonding the dielectric layers 111 and 112 to each other. Each of the dielectric layers 111 and 112 may include a material having a high dielectric constant Dk. For example, the dielectric layers 111 and 112 may be a ceramic layer and/or a ceramic-polymer composite layer, respectively. However, an example embodiment is not limited thereto, and the dielectric layers 111 and 112 may include an insulating material having a high dielectric constant Dk such as PTFE. The ceramic-polymer composite layer may be obtained by dispersing a ceramic filler in an organic binder. As the organic binder, a polymer such as PTFE or epoxy may be used. As the ceramic filler, a filler including $SiO_2$, $TiO_2$, $Al_2O_3$, or the like, may be used. The ceramic filler may have various shapes, such as an angular shape or a circular shape. A diameter of the ceramic filler may be 50 μm or less. The ceramic-polymer composite layer may include glass fibers as a reinforcing material if necessary.

The bonding layer 113 may have a dielectric constant (Dk) smaller than that of the dielectric layers 111 and 112 and may include a material having a good bonding strength. For example, the bonding layer 113 may include a polymer such as PTFE or epoxy having a lower dielectric constant Dk than that of a material of the dielectric layers 111 and 112. A thickness of the bonding layer 113 may be less than a thickness of each of the dielectric layers 111 and 112.

The antenna pattern 120 may include a metal material. As a metal material, copper (Cu), aluminum (Al), silver (Ag), Tin (Sn), gold (Au), nickel (Ni), lead (Pb), titanium (Ti), or an alloy thereof may be used. The antenna pattern 120 may be formed by a plating process such as AP, SAP, MSAP, or TT, and may thus include a seed layer, an electroless plating layer, and an electrolytic plating layer formed on the basis of the seed layer. The antenna pattern 120 may include a patch pattern 121, a coupling pattern 122, and pad patterns 123 and 124.

The patch pattern 121 may receive an RF signal through a feed pattern and a feed via disposed in the wiring structure 300 and may transmit the signal in the thickness direction (z-direction), and may transmit the RF signal received in the thickness direction to the electronic component 700, a radio frequency IC (RFIC) 710, for example, through the feed pattern and the feed via disposed in the wiring structure 300. The patch pattern 121 may have an intrinsic resonance frequency according to an intrinsic factor such as a shape, a size, a height, and a dielectric constant of the insulating layer, such as 28 GHz or 39 GHz . For example, the patch pattern 121 may be electrically connected to the electronic component 700, the RFIC 710, for example, through the feed pattern and the feed via disposed in the wiring structure 300 such that the patch pattern 121 may transmit and receive a horizontal pole (V-pole) RF signal and a vertical pole (V-pole) RF signal.

The coupling pattern 122 may be disposed above the patch pattern 121, such as in the thickness direction, for example. The coupling pattern 122 may be disposed such that at least a portion of the patch pattern 121 may overlap at least a portion of the patch pattern 121 on a plane. Due to the electromagnetic coupling between the coupling pattern 122 and the patch pattern 121, an additional resonant frequency adjacent to the above-described intrinsic resonant frequency may be obtained, and thus a wider bandwidth may be obtained.

The pad patterns 123 and 124 may connect the antenna 100' to the wiring structure 300. For example, the pad pattern 123 may be connected to the patch pattern 121 through the feed via 130 penetrating the dielectric layer 111, and may be connected to a feed pattern of the plurality of first wiring layers 170 disposed in the first region 150 of the wiring structure 300 through the connection via 133. Also, the pad pattern 124 may be disposed to surround the pad pattern 123, and if necessary, the pad pattern 124 maybe connected to a ground pattern of the plurality of first wiring layers 170 disposed in the first region 150 of the wiring structure 300 through a connection via.

The feed via 130 may include a metal material . As a metal material, copper (Cu), aluminum (Al), silver (Ag), Tin (Sn), gold (Au), nickel (Ni), lead (Pb), titanium (Ti), or an alloy thereof, maybe used. The feed via 130 maybe formed by a plating process such as AP, SAP, MSAP, or TT, and may thus include a seed layer, an electroless plating layer, and an electrolytic plating layer formed on the basis of the seed layer. The feed via 130 maybe entirely filled with a metal material, or a metal material may be formed along a wall surface of the via hole. Also, the feed via 130 may have various shapes such as a cylindrical shape, an hourglass shape, or the like.

Also, the antenna modules 800C and 800D in another example may further include the electronic component 700 surface-mounted on the lower surface of the wiring structure 300, differently from the antenna modules 800A and 800B described in the aforementioned example embodiment. The electronic component 700 may include various types of active components and/or passive components. For example, the electronic component 700 may include an RFIC 710, a power management IC (PMIC) 720, or the like. The electronic component 700 may also include a chip-type passive component, such as a chip-type capacitor or a chip-type inductor, for example. The electronic components 700 may be connected to at least a portion of the plurality of second wiring layers 220 disposed in the second region 200 of the wiring structure 300 through connection metals 715 and 725. The connection metals 715 and 725 may be formed of a low melting point metal having a lower melting point than that of copper (Cu), such as tin (Sn) or an alloy including tin (Sn), for example. For example, the connection metals 715 and 725 may be formed of solder, for example, but an example of the material is not limited thereto.

As the other descriptions are substantially the same as those described above, and overlapping descriptions will not be repeated.

Figure 10:
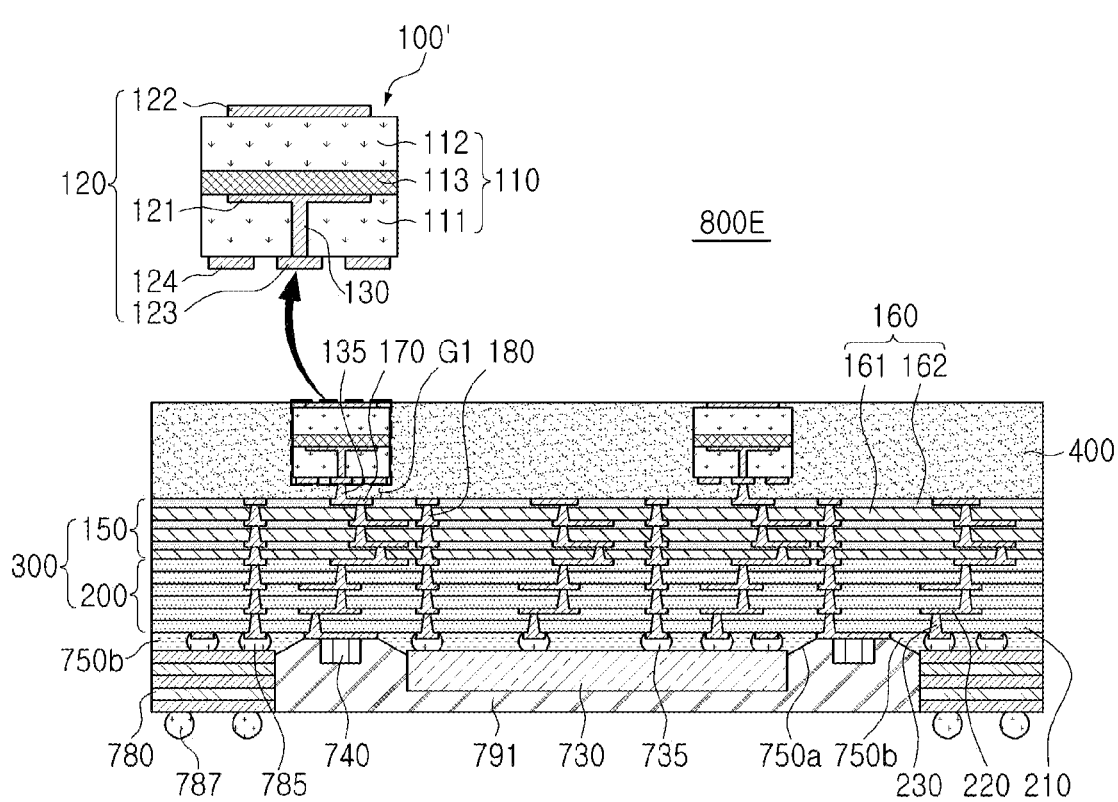
FIG. 10 is a cross-sectional diagram illustrating another example of an antenna module.

FIG. 10 is a cross-sectional diagram illustrating another example of an antenna module.

Figure 11:
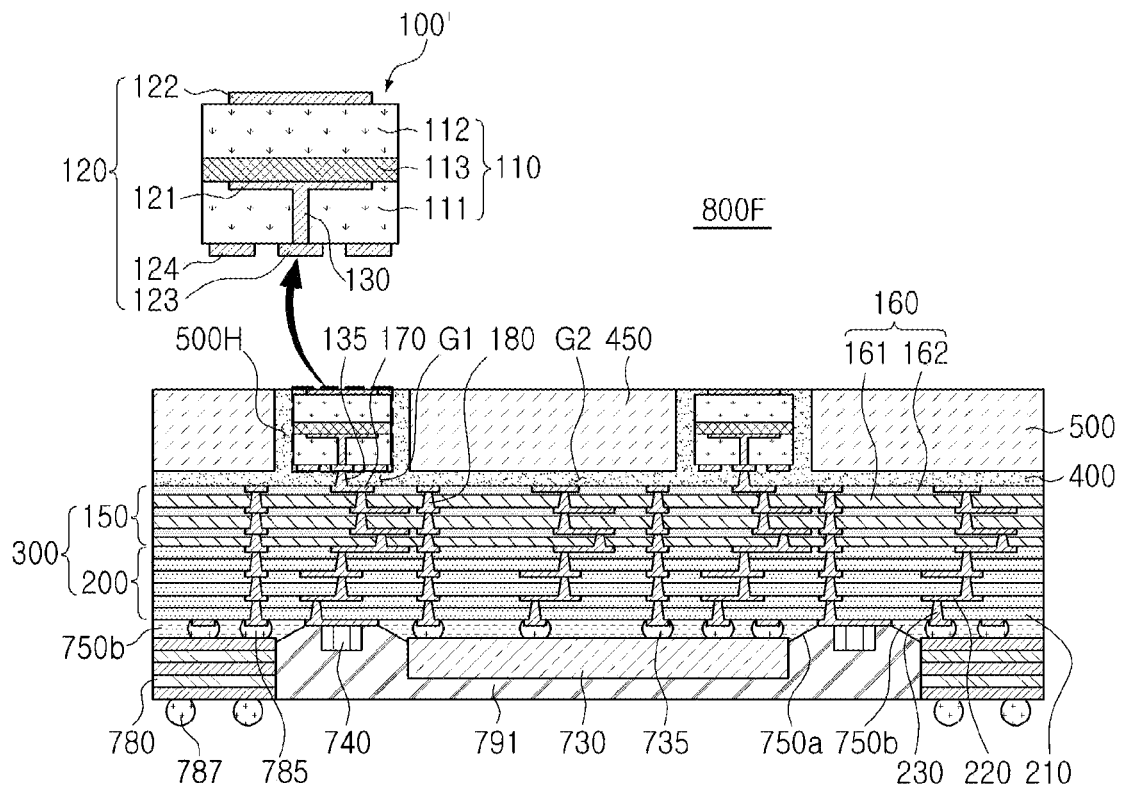
FIG. 11 is a cross-sectional diagram illustrating another example of an antenna module.

FIG. 11 is a cross-sectional diagram illustrating another example of an antenna module.

Referring to the diagrams, in the antenna modules 800E and 800F in another example, a semiconductor chip 730 and a passive component 740 may be surface-mounted on a lower surface of a wiring structure 300 as electronic components, differently from the antenna modules 800C and 800D described in the aforementioned example embodiment. The semiconductor chip 730 may include RFIC, PMIC, or the like. The passive component 740 may include a chip-type capacitor, a chip-type inductor, and the like. The semiconductor chip 730 may be surface-mounted through the connection metal 735. The passive component 740 may also be surface-mounted and disposed through a connection metal such as solder. The semiconductor chip 730 may be fixed through an underfill resin 750a disposed on the lower surface of the wiring structure 300. The underfill resin 750a may include a general insulating resin having adhesive properties, such as an epoxy resin.

Also, in the antenna modules 800E and 800F in another example, a molding material 791 covering the semiconductor chip 730 and the passive component 740 may be disposed on the lower surface of the wiring structure 300, differently from the antenna modules 800C and 800D described in the aforementioned example embodiment. The electronic component may be protected by the molding material 791. The molding material 791 may be a general epoxy molding compound (EMC) . However, an example embodiment thereof is not limited thereto, and ABF, or the like, may be used as the molding material 791.

Also, in the antenna modules 800E and 800F in another example, an interposer 780 may be disposed on the lower surface of the wiring structure 300, differently from the antenna modules 800C and 800D described in the aforementioned example embodiment. The interposer 780 may be disposed side by side with electronic components such as the semiconductor chip 730 and the passive component 740. The interposer 780 maybe connected to at least a portion of the plurality of second wiring layers 220 disposed in the second region 200 of the wiring structure 300 through the connection metal 785 disposed in an upper portion. Also, the interposer 780 may be connected to another type of printed circuit board such as a main board through the connection metal 787 on a lower side. The interposer 780 may be fixed through the underfill resin 750b. The interposer 780 may be an organic interposer using an insulating resin as an insulating body. However, an example embodiment thereof is not limited thereto, and may be a silicon interposer using silicon as an insulating body. The interposer 780 maybe a ring-shaped single substrate having a through-portion in which an electronic component such as the semiconductor chip 730 is disposed, or may include a plurality of units spaced apart from each other.

As the other descriptions are substantially the same as those described above, and overlapping descriptions will not be repeated.

Figure 12:
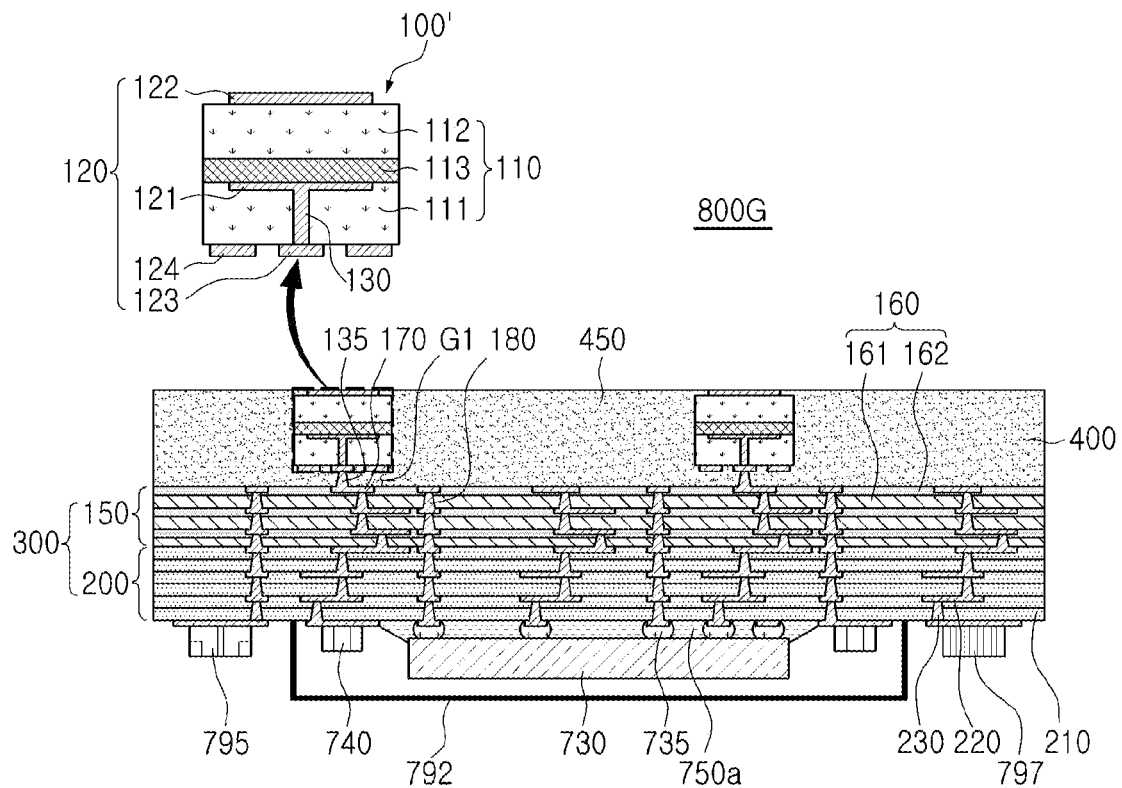
FIG. 12 is a cross-sectional diagram illustrating another example of an antenna module.

FIG. 12 is a cross-sectional diagram illustrating another example of an antenna module.

Figure 13:
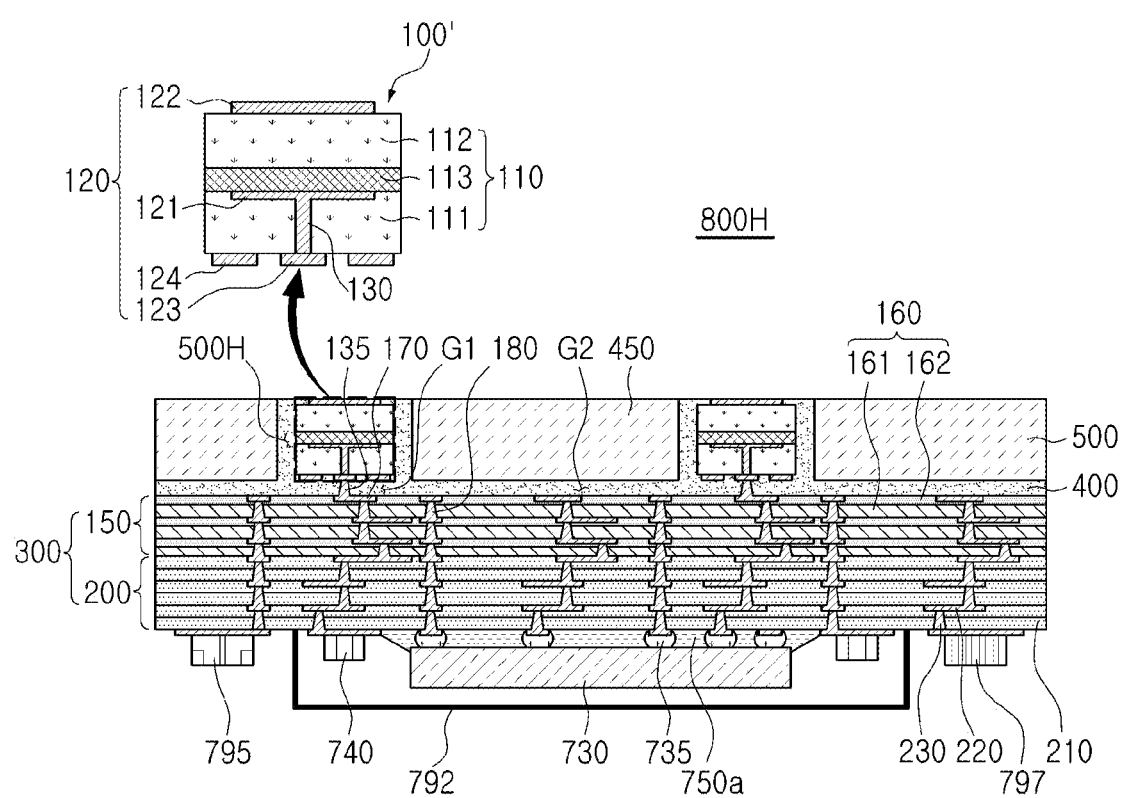
FIG. 13 is a cross-sectional diagram illustrating another example of an antenna module.

FIG. 13 is a cross-sectional diagram illustrating another example of an antenna module.

Referring to the diagrams, the antenna modules 800G and 800H in another example may further include a shield can 792 disposed on the lower surface of a wiring structure 300 and surrounding electronic components, such as a semiconductor chip 730 and a passive component 740, for example, instead of the molding material 791. Electromagnetic interference (EMI) may be shielded through the shield can 792. The shield can 792 may include a metal material. As the metal material, copper (Cu), aluminum (Al), silver (Ag), Tin (Sn), gold (Au), nickel (Ni), lead (Pb), titanium (Ti), or an alloy thereof may be used. However, the material of the shield can 792 is not limited to metal, and may be, for example, a synthetic resin material including metal powder.

Also, in the antenna module 800G and 800H in another example, connectors 795 and 797 may further be disposed on a lower surface of the wiring structure 300, instead of the interposer 780, differently from the antenna modules 800E and 800F described in the aforementioned example embodiment. A left connector 795 may be an RF receptacle, and may be connected to at least a portion of the plurality of second wiring layers 220 disposed in the second region 200 of the wiring structure 300. A right connector 797 maybe a connector for connecting signals and/or power, and may be connected to at least a portion of the plurality of second wiring layers 220 disposed in the second region 200 of the wiring structure 300. The antenna modules 800G and 800H may be connected to other types of printed circuit boards such as a main board through the connectors 795 and 797.

As the other descriptions are substantially the same as those described above, and overlapping descriptions will not be repeated.

According to the aforementioned example embodiments, an antenna module which may have a reduced size by reducing a thickness may be provided.

Also, an antenna module which may improve antenna performance may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like maybe used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been shown and described above, it will be apparent to those skilled in the art that modifications and variations could be made without departing from the scope of the present invention as defined by the appended claims.

What is claimed is:

1. An antenna module, comprising:
a wiring structure including a plurality of insulating layers, a plurality of wiring layers, and a plurality of via layers;
an antenna disposed on an upper surface of the wiring structure; and
an encapsulant disposed on the upper surface of the wiring structure and covering at least a portion of the antenna,
wherein an uppermost wiring layer of the plurality of wiring layers is connected to the antenna through a connection via of an uppermost via layer of the plurality of via layers, and
wherein the connection via penetrates at least a portion of the encapsulant.

2. The antenna module of claim 1, wherein an upper surface of an uppermost insulating layer of the plurality of insulating layers is disposed on a level the same as a level of an upper surface of the uppermost wiring layer.

3. The antenna module of claim 1,
wherein the antenna includes a dielectric body, an antenna pattern disposed on an upper surface of the dielectric body, and a pad pattern disposed on a lower surface of the dielectric body, and
wherein the connection via is connected to the pad pattern.

4. The antenna module of claim 3, wherein an upper surface of the encapsulant is disposed on a level the same as a level of an upper surface of the antenna pattern.

5. The antenna module of claim 1,
wherein the antenna includes a first dielectric layer, a bonding layer disposed on an upper surface of the first dielectric layer, a second dielectric layer disposed on an upper surface of the bonding layer, a first antenna pattern disposed on the upper surface of the first dielectric layer and buried in the bonding layer, a second antenna pattern disposed on an upper surface of the second dielectric layer and having at least a portion overlapping the first antenna pattern on a plane, a pad pattern disposed on a lower surface of the first dielectric layer, and a feed via penetrating the first dielectric layer and connecting the first antenna pattern to the pad pattern, and
wherein the connection via is connected to the pad pattern.

6. The antenna module of claim 5, wherein each of the first and second dielectric layers includes one of a ceramic layer and a ceramic-polymer composite layer.

7. The antenna module of claim 6, wherein the first and second dielectric layers include the same material.

8. The antenna module of claim 6, wherein a material of the first dielectric layer differs from that of the second dielectric layer.

9. The antenna module of claim 1, further comprising:
a core structure disposed on the upper surface of the wiring structure, spaced apart from the antenna, and surrounding at least a portion of a side surface of the antenna.

10. The antenna module of claim 9, wherein the core structure has a through-hole in which the antenna is disposed.

11. The antenna module of claim 9, wherein the upper surface of the encapsulant is disposed on a level the same as a level of an upper surface of the core structure.

12. The antenna module of claim 1, further comprising:
an electronic component disposed on a lower surface of the wiring structure, and connected to at least a portion of a lowermost wiring layer of the plurality of wiring layers,
wherein the electronic component includes at least one of a power management integrated circuit or a radio frequency integrated circuit.

13. The antenna module of claim 12, further comprising:
a connection structure disposed side by side with the electronic component on the lower surface of the wiring structure and connected to at least the other portion of the lowermost wiring layer, wherein the connection structure includes at least one of an interpose or a connector.

14. The antenna module of claim 12, further comprising:
a shield can disposed on a lower surface of the wiring structure, spaced apart from the electronic component, and surrounding at least a portion of the electronic component.

15. The antenna module of claim 1,
wherein the wiring structure includes a first region including a plurality of first insulating layers, a plurality of first wiring layers, and a plurality of first via layers, and a second region including disposed above the first region and including a plurality of second insulating layers, a plurality of second wiring layers, and a plurality of second via layers, and
wherein at least a portion of the plurality of first insulating layers includes a material having a dielectric loss factor (Df) lower than that of at least a portion of the plurality of second insulating layers.

16. The antenna module of claim 15, wherein the plurality of first insulating layers include a laminate in which a thermoplastic resin layer and a thermosetting resin layer are alternately layered.

17. An antenna module, comprising:
a wiring structure including a plurality of insulating layers, a plurality of wiring layers, and a plurality of via layers;
an antenna disposed on an upper surface of the wiring structure; and
an encapsulant disposed on the upper surface of the wiring structure and covering at least a portion of the antenna,
wherein an uppermost wiring layer of the plurality of wiring layers is connected to the antenna through a connection via of an uppermost via layer of the plurality of via layers, and
wherein the encapsulant is disposed in at least a portion of a region between an upper surface of an uppermost insulating layer of the plurality of insulating layers and a lower surface of the antenna.

18. The antenna module of claim 17, further comprising:
a core structure disposed on the upper surface of the wiring structure, spaced apart from the antenna, and surrounding at least a portion of a side surface of the antenna,
wherein the encapsulant fills at least a portion of a region between the upper surface of the uppermost insulating layer and a lower surface of the core structure.

19. An antenna module, comprising:
a wiring structure including a plurality of insulating layers, a plurality of wiring layers, and a plurality of via layers;
an antenna disposed on an upper surface of the wiring structure; and
an encapsulant disposed on the upper surface of the wiring structure and covering at least a portion of the antenna,
wherein an uppermost wiring layer of the plurality of wiring layers is connected to a pad pattern of the antenna disposed on a lower surface of the antenna, and
wherein an upper surface of the antenna opposing the lower surface of the antenna is exposed from the encapsulant.

20. The antenna module of claim 19, wherein the uppermost wiring layer of the plurality of wiring layers is connected to the lower surface of the antenna through a connection via of an uppermost via layer of the plurality of via layers.

* * * * *